United States Patent
Deng

(10) Patent No.: US 10,068,933 B2
(45) Date of Patent: Sep. 4, 2018

(54) ARRAY SUBSTRATE MANUFACTURING METHOD AND ARRAY SUBSTRATE

(71) Applicant: Wuhan China Star Optoelectronics Technology Co., Ltd., Wuhan (CN)

(72) Inventor: Si Deng, Wuhan (CN)

(73) Assignee: WUHAN CHINA STAR OPTOELECTRONICS TECHNOLOGY CO., LTD., Wuhan, Hubei (CN)

(*) Notice: Subject to any disclaimer, the term of this patent is extended or adjusted under 35 U.S.C. 154(b) by 174 days.

(21) Appl. No.: 15/031,279

(22) PCT Filed: Feb. 29, 2016

(86) PCT No.: PCT/CN2016/074791
§ 371 (c)(1),
(2) Date: Apr. 22, 2016

(87) PCT Pub. No.: WO2017/136967
PCT Pub. Date: Aug. 17, 2017

(65) Prior Publication Data
US 2018/0047764 A1    Feb. 15, 2018

(30) Foreign Application Priority Data

Feb. 14, 2016   (CN) .......................... 2016 1 0084686

(51) Int. Cl.
*H01L 21/00*    (2006.01)
*H01L 27/12*    (2006.01)
(Continued)

(52) U.S. Cl.
CPC ........ *H01L 27/1288* (2013.01); *G02F 1/1368* (2013.01); *G02F 1/13439* (2013.01);
(Continued)

(58) Field of Classification Search
CPC .......... G02F 2001/13685; G02F 2001/134318; G02F 1/1368; G02F 1/136209;
(Continued)

(56) References Cited

U.S. PATENT DOCUMENTS

2003/0094615 A1* 5/2003 Yamazaki ............... H01L 27/12
257/72
2011/0101353 A1* 5/2011 Park .................. H01L 29/78633
257/59

* cited by examiner

Primary Examiner — Thinh T Nguyen
(74) Attorney, Agent, or Firm — Leong C. Lei

(57) ABSTRACT

The present invention provides an array substrate manufacturing method and an array substrate. The array substrate manufacturing method of the present invention uses an organic photoresist material to form a passivation protection layer (90) for substituting the conventional passivation protection layer that is made of a silicon nitride material and applies one mask to subject the passivation protection layer (90) and a planarization layer (70) to exposure and development so as to obtain a third via (91) that is located above the first drain electrode (62) and a fourth via (92) that is located above the second drain electrode (64) and, thus, compared the prior art techniques, saves one mask and reduces one etching process so as to achieve the purposes of simplifying the manufacturing process and saving manufacturing cost. The array substrate of the present invention has a simple structure and low manufacturing cost and possesses excellent electrical performance.

14 Claims, 10 Drawing Sheets

(51) Int. Cl.
*H01L 29/786* (2006.01)
*H01L 29/49* (2006.01)
*G02F 1/1368* (2006.01)
*G02F 1/1362* (2006.01)
*G02F 1/1333* (2006.01)
*G02F 1/1343* (2006.01)

(52) U.S. Cl.
CPC .. *G02F 1/133345* (2013.01); *G02F 1/134309* (2013.01); *G02F 1/136209* (2013.01); *G02F 1/136227* (2013.01); *H01L 27/124* (2013.01); *H01L 27/1222* (2013.01); *H01L 27/1251* (2013.01); *H01L 27/1274* (2013.01); *H01L 29/4908* (2013.01); *H01L 29/78621* (2013.01); *H01L 29/78633* (2013.01); *H01L 29/78675* (2013.01); *G02F 2001/13685* (2013.01); *G02F 2001/134318* (2013.01); *G02F 2001/136231* (2013.01); *G02F 2202/104* (2013.01)

(58) Field of Classification Search
CPC ......... G02F 1/133345; H01L 27/14689; H01L 227/1463; H01L 27/112; H01L 27/1288; H01L 27/1222; H01L 27/124; H01L 27/1251; H01L 27/1274; H01L 29/78675; H01L 29/7863
USPC ...... 438/48, 128, 149, 151, 283; 257/72, 98, 257/88
See application file for complete search history.

ARRAY SUBSTRATE MANUFACTURING METHOD AND ARRAY SUBSTRATE

BACKGROUND OF THE INVENTION

1. Field of the Invention

The present invention relates to the field of display technology, and in particular to an array substrate manufacturing method and an array substrate.

2. The Related Arts

With the progress of the display technology, liquid crystal displays (LCDs), due to a variety of advantages, such as high image quality, low power consumption, thin device body, and wide application, have been widely used in various consumer electronic products, such as mobile phones, televisions, personal digital assistants (PDAs), digital cameras, notebook computers, and desktop computers, making them the main stream of display devices.

Most of the liquid crystal display devices that are currently available in the market are backlighting LCDs, which comprise a liquid crystal display panel and a backlight module. The working principle of the liquid crystal display panel is that liquid crystal molecules are arranged between two parallel glass substrates with a number of vertical and horizontal tiny electrical wires arranged between the two glass substrates and the liquid crystal molecules are controlled to rotate according to whether electricity is applied or not so as to refract out light from the backlight module to generate an image.

A liquid crystal display panel is generally composed of a color filter (CF) substrate, a thin-film transistor (TFT) substrate, liquid crystal (LC) interposed between the CF substrate and the TFT substrate, and sealant, and the manufacturing process generally comprises a front-stage array engineering process (thin-film, photolithography, etching, and stripping), a middle-stage cell engineering process (lamination of thin-film transistor (TFT) substrate and color filter (CF) substrate), and a rear-stage module assembly process (combination of driving integrated circuit (IC) and printed circuit board). The front-stage array engineering process is generally forming a TFT substrate for controlling movement of liquid crystal molecules; the middle-stage cell engineering process is generally filling liquid crystal between the TFT substrate and the CF substrate; and the rear-stage module assembly process is generally combining the driving IC and the printed circuit board for driving the rotation of the liquid crystal molecules to display an image.

Low temperature poly silicon (LTPS) is a display technique that is commonly used in medium- and small-sized electronic products. The conventional amorphous silicon material has an electron mobility that is around 0.5-1.0 $cm^2/V.S$, but LTPS has an electron mobility that may reach 30-300 $cm^2/V.S$. Thus, an LTPS liquid crystal display possesses a variety of advantages, such as high resolution, fast response speed, and high aperture ratio. On the other hand, an LTPS semiconductor device has a small size and high degree of integration so that the manufacturing process of a complete LTPS array substrate is complicated and the manufacturing cost is high.

Heretofore, an array substrate of the main-stream display panels comprises a passivation protection layer (PV) that is generally formed of a single-layered structure of silicon nitride (of which the molecular formula is $SiN_x$). Silicon nitride is an excellent insulation material and has good light transmission, dielectric constant being around 6-9.

In a currently adopted flow for manufacturing an LTPS array substrate, a process that is applied to pattern a planarization layer and a passivation protection layer to form a pixel electrode and a contact hole of a drain electrode is as follows: step 1: as shown in FIG. 1, firstly forming a planarization layer (PLN) 700 and applying a mask to subject the planarization layer 700 to exposure and development so as to form a first via 710 above the a drain electrode 620; and step 2: as shown in FIG. 2, forming a patternized common electrode layer (BITO) 810 on the planarization layer 700, depositing a silicon nitride material on the common electrode layer 810 to form a passivation protection layer 900, applying exposure and etching operations to subject the passivation protection layer 900 to patterning so as to form a second via 910 inside the first via 710. The second via 910 is provided for contact between the pixel electrode and the drain electrode 620.

However, in the above-described manufacturing process, two masks and performance of one etching operation are necessary so that the manufacturing cost is high and the manufacturing flow is complicated.

SUMMARY OF THE INVENTION

An object of the present invention is to provide an array substrate manufacturing method, which, compared to the prior art technology, saves one mask and also saves one etching process so as to simplify the manufacturing process and reduce the manufacturing cost.

Another object of the present invention is to provide an array substrate, which has a simple structure, low manufacturing cost, and excellent electrical performance.

To achieve the above objects, the present invention provides an array substrate manufacturing method, which comprises the following steps:

(1) providing a base plate, depositing a first metal layer on the base plate, and subjecting the first metal layer to a patterning operation to obtain a light shielding layer;

(2) forming a buffer layer on the light shielding layer and the base plate, forming an amorphous layer on the buffer layer, subjecting the amorphous layer to crystallization treatment so as to form a poly silicon layer, applying a photolithographic process to subject the poly silicon layer to a patterning operation to obtain a first poly silicon section located above and corresponding to the light shielding layer and a second poly silicon section that is spaced from the first poly silicon section;

(3) using a mask to subject a middle area of the first poly silicon section to P type light doping to obtain a first channel zone, and then using a mask to subject two opposite end portions of the first poly silicon section to N type heavy doping to obtain N type heavy doping zones at the two ends;

(4) depositing a gate insulation layer on the first poly silicon section, the second poly silicon section, and the buffer layer, depositing a second metal layer on the gate insulation layer, applying a photolithographic process to subject the gate insulation layer and the second metal layer to a patterning operation to obtain a first gate insulation layer and a second gate insulation layer that are in the gate insulation layer and respectively correspond to the middle areas of the first poly silicon section and the second poly silicon section and a first gate electrode and a second gate electrode that are in the second metal layer and respectively located above the first and second gate insulation layers to align with the first and second gate insulation layers;

(5) using the first gate electrode as a mask to subject portions of the first poly silicon section that are located between the first channel zone and the N type heavy doping zones to N type light doping, so as to obtain N type light doping zones, and using a mask to subject two end portions of the second poly silicon section to P type heavy doping so as to obtain P type heavy doping zones at the two ends and a second channel zone between the two P type heavy doping zones;

(6) depositing an interlayer insulation layer on the first gate electrode, the second gate electrode, the first poly silicon section, the second poly silicon section, and the buffer layer, applying a photolithographic process to subject the interlayer insulation layer to a patterning operation so as to form, in the interlayer insulation layer, first vias located above and corresponding to the N type heavy doping zones and second vias located above and corresponding to the P type heavy doping zones;

(7) depositing a third metal layer on the interlayer insulation layer and subjecting the third metal layer to a patterning operation to obtain a first source electrode, a first drain electrode, a second source electrode, and a second drain electrode that are spaced from each other such that the first source electrode and the first drain electrode are respectively connected, through the first vias, to the N type heavy doping zones and the second source electrode and the second drain electrode are respectively connected, through the second vias, to the P type heavy doping zones;

(8) forming a planarization layer on the first source electrode, the first drain electrode, the second source electrode, the second drain electrode, and the interlayer insulation layer; and depositing a first transparent conductive layer on the planarization layer and subjecting the first transparent conductive layer to a patterning operation to obtain a common electrode;

(9) depositing an organic photoresist material on the common electrode and the planarization layer to form a passivation protection layer;

(10) using a mask to subject the passivation protection layer and the planarization layer to exposure and development so as to obtain a third via located above and corresponding to the first drain electrode and a fourth via located above and corresponding to the second drain electrode; and

(11) depositing a second transparent conductive layer on the passivation protection layer and subjecting the second transparent conductive layer to a patterning operation so as to obtain a pixel electrode, wherein the pixel electrode is connected, through the third via and the fourth via, to the first drain electrode and the second drain electrode, respectively.

In step (2), laser annealing is used for the crystallization treatment of the amorphous layer.

Step (6) further comprises: subjecting the interlayer insulation layer to dehydrogenation and activation.

Rapid thermal annealing is applied for dehydrogenation and activation of the interlayer insulation layer.

In step (9), an evaporation or jet printing process is applied to deposit the organic photoresist material.

Step 9 further comprises: subjecting the passivation protection layer to irradiation of ultraviolet light to thin the passivation protection layer 90 so as to increase light transmittability thereof.

The planarization layer is made of a material comprising organic photoresist and the passivation protection layer has a dielectric constant that is around 3-4.

The base plate is a transparent plate; the first metal layer, the second metal layer, the third metal layer are formed of a material comprising one of molybdenum, titanium, aluminum, and copper or a stacked combination of multiple ones thereof; the buffer layer, the first and second gate insulation layers, and the interlayer insulation layer are each a silicon oxide layer, a silicon nitride layer, or a composite layer of stacked silicon oxide layer and silicon nitride layer; and the first transparent conductive layer and the second transparent conductive layer are made of a material comprising a metal oxide The present invention also provides an array substrate, which comprises a base plate, a light shielding layer located on the base plate, a buffer layer located on the light shielding layer and the base plate, a first poly silicon section and a second poly silicon section located on the buffer layer, a first gate insulation layer and a second gate insulation layer respectively located on middle areas of the first poly silicon section and the second poly silicon section, a first gate electrode and a second gate electrode respectively located on the first gate insulation layer and the second gate insulation layer and in alignment with the first and second gate insulation layers, an interlayer insulation layer located on the first gate electrode, the second gate electrode, the first poly silicon section, the second poly silicon section, and the buffer layer, a first source electrode, a first drain electrode, a second source electrode, and a second drain electrode located on the interlayer insulation layer, a planarization layer located on the first source electrode, the first drain electrode, the second source electrode, the second drain electrode, and the interlayer insulation layer, a common electrode located on the planarization layer, a passivation protection layer located on the common electrode and the planarization layer, and a pixel electrode located on the passivation protection layer;

the first poly silicon section comprising a first channel zone corresponding to and located under the first gate insulation layer, N type heavy doping zones respectively located at two ends, and N type light doping zones respectively located between the N type heavy doping zones and the first channel zone; the second poly silicon section comprising a first channel zone corresponding to and located under the second gate insulation layer and P type heavy doping zones respectively located at two ends;

the interlayer insulation layer comprising first vias corresponding to and located above the N type heavy doping zones and second vias corresponding to and located above the P type heavy doping zones; the first source electrode and the first drain electrode being respectively connected, through the first vias, to the N type heavy doping zones; and the second source electrode and the second drain electrode being respectively connected, through the second vias, to the P type heavy doping zones;

the planarization layer and the passivation protection layer being both made of a material comprises an organic photoresist, the passivation protection layer and the planarization layer comprising, formed therein, a third via corresponding to and located above the first drain electrode and a fourth via corresponding to and located above the second drain electrode, the pixel electrode being electrically connected, through the third via and the fourth via, to the first drain electrode and the second drain electrode respectively.

The passivation protection layer has a dielectric constant that is around 3-4; the base plate is a transparent plate; the first metal layer, the second metal layer, and the third metal layer are formed of a material comprising one of molybdenum, titanium, aluminum, and copper or a stacked combination of multiple ones thereof; the buffer layer, the first and second gate insulation layers, and the interlayer insulation layer are each a silicon oxide layer, a silicon nitride layer, or a composite layer of stacked silicon oxide layer and silicon nitride layer; and the first transparent conductive layer and the second transparent conductive layer are formed of a material comprises a metal oxide.

The present invention further provides an array substrate manufacturing method, which comprises the following steps:

(1) providing a base plate, depositing a first metal layer on the base plate, and subjecting the first metal layer to a patterning operation to obtain a light shielding layer;

(2) forming a buffer layer on the light shielding layer and the base plate, forming an amorphous layer on the buffer layer, subjecting the amorphous layer to crystallization treatment so as to form a poly silicon layer, applying a photolithographic process to subject the poly silicon layer to a patterning operation to obtain a first poly silicon section located above and corresponding to the light shielding layer and a second poly silicon section that is spaced from the first poly silicon section;

(3) using a mask to subject a middle area of the first poly silicon section to P type light doping to obtain a first channel zone, and then using a mask to subject two opposite end portions of the first poly silicon section to N type heavy doping to obtain N type heavy doping zones at the two ends;

(4) depositing a gate insulation layer on the first poly silicon section, the second poly silicon section, and the buffer layer, depositing a second metal layer on the gate insulation layer, applying a photolithographic process to subject the gate insulation layer and the second metal layer to a patterning operation to obtain a first gate insulation layer and a second gate insulation layer that are in the gate insulation layer and respectively correspond to the middle areas of the first poly silicon section and the second poly silicon section and a first gate electrode and a second gate electrode that are in the second metal layer and respectively located above the first and second gate insulation layers to align with the first and second gate insulation layers;

(5) using the first gate electrode as a mask to subject portions of the first poly silicon section that are located between the first channel zone and the N type heavy doping zones to N type light doping, so as to obtain N type light doping zones, and using a mask to subject two end portions of the second poly silicon section to P type heavy doping so as to obtain P type heavy doping zones at the two ends and a second channel zone between the two P type heavy doping zones;

(6) depositing an interlayer insulation layer on the first gate electrode, the second gate electrode, the first poly silicon section, the second poly silicon section, and the buffer layer, applying a photolithographic process to subject the interlayer insulation layer to a patterning operation so as to form, in the interlayer insulation layer, first vias located above and corresponding to the N type heavy doping zones and second vias located above and corresponding to the P type heavy doping zones;

(7) depositing a third metal layer on the interlayer insulation layer and subjecting the third metal layer to a patterning operation to obtain a first source electrode, a first drain electrode, a second source electrode, and a second drain electrode that are spaced from each other such that the first source electrode and the first drain electrode are respectively connected, through the first vias, to the N type heavy doping zones and the second source electrode and the second drain electrode are respectively connected, through the second vias, to the P type heavy doping zones;

(8) forming a planarization layer on the first source electrode, the first drain electrode, the second source electrode, the second drain electrode, and the interlayer insulation layer; and depositing a first transparent conductive layer on the planarization layer and subjecting the first transparent conductive layer to a patterning operation to obtain a common electrode;

(9) depositing an organic photoresist material on the common electrode and the planarization layer to form a passivation protection layer;

(10) using a mask to subject the passivation protection layer and the planarization layer to exposure and development so as to obtain a third via located above and corresponding to the first drain electrode and a fourth via located above and corresponding to the second drain electrode; and

(11) depositing a second transparent conductive layer on the passivation protection layer and subjecting the second transparent conductive layer to a patterning operation so as to obtain a pixel electrode, wherein the pixel electrode is connected, through the third via and the fourth via, to the first drain electrode and the second drain electrode, respectively;

wherein in step (2), laser annealing is used for the crystallization treatment of the amorphous layer; and wherein step (6) further comprises: subjecting the interlayer insulation layer to dehydrogenation and activation.

The efficacy of the present invention is that an array substrate manufacturing method of the present invention uses an organic photoresist material to form a passivation protection layer for substituting the conventional passivation protection layer that is made of a silicon nitride material and applies one mask to subject the passivation protection layer and a planarization layer to exposure and development so as to obtain a third via that is located above the first drain electrode and a fourth via that is located above the second drain electrode and, thus, compared the prior art techniques, saves one mask and reduces one etching process so as to achieve the purposes of simplifying the manufacturing process and saving manufacturing cost. The array substrate of the present invention has a simple structure and low manufacturing cost and possesses excellent electrical performance.

For better understanding of the features and technical contents of the present invention, reference will be made to the following detailed description of the present invention and the attached drawings. However, the drawings are provided for the purposes of reference and illustration and are not intended to impose limitations to the present invention.

BRIEF DESCRIPTION OF THE DRAWINGS

The technical solution, as well as other beneficial advantages, of the present invention will be apparent from the following detailed description of embodiments of the present invention, with reference to the attached drawing. In the drawing.

DETAILED DESCRIPTION OF THE PREFERRED EMBODIMENTS

To further expound the technical solution adopted in the present invention and the advantages thereof, a detailed description is given to a preferred embodiment of the present invention and the attached drawings.

Figure 1:
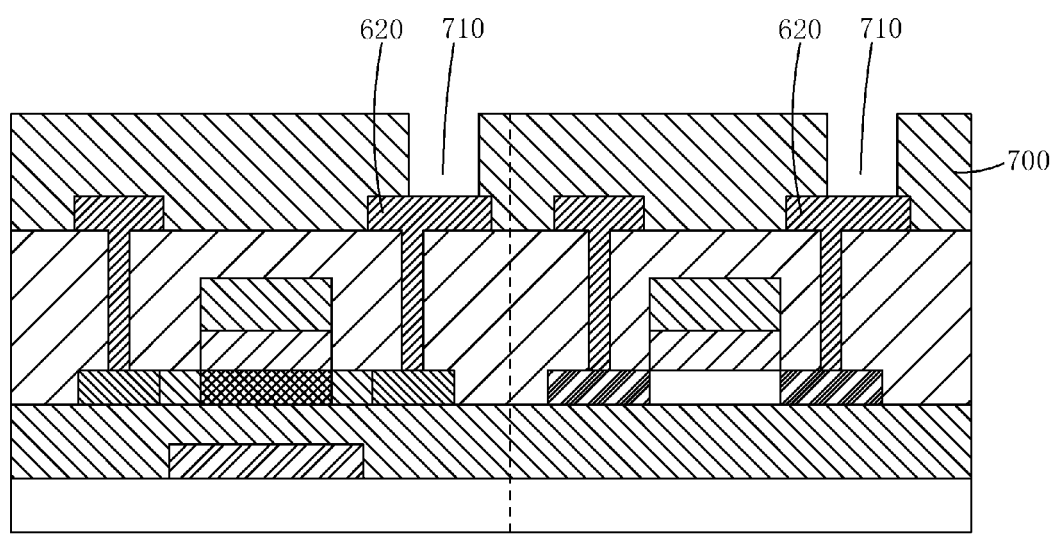
FIGS. 1-2 are schematic views illustrating a patterning process of a planarization layer and a passivation protection layer of a conventional array substrate manufacturing method.
Figure 2:
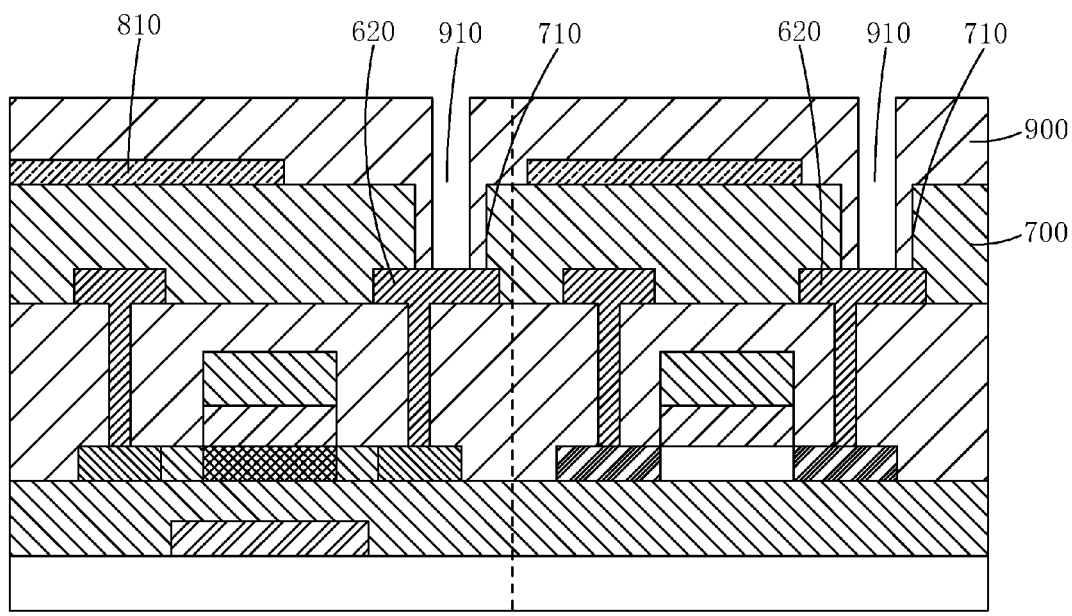
Figure 3:
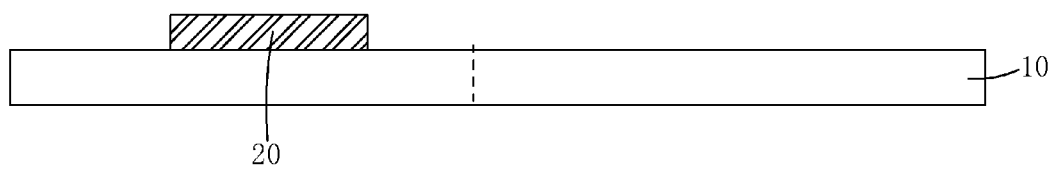
FIG. 3 is a schematic view illustrating step 1 of an array substrate manufacturing method according to the present invention.

Referring to FIGS. 3-13, the present invention provides an array substrate manufacturing method, which comprises the following steps:

Step 1: as shown in FIG. 3, providing a base plate 10, depositing a first metal layer on the base plate 10, and subjecting the first metal layer to a patterning operation to obtain a light shielding layer 20.

Specifically, the base plate 10 is a transparent plate, and preferably a glass plate.

Figure 4:
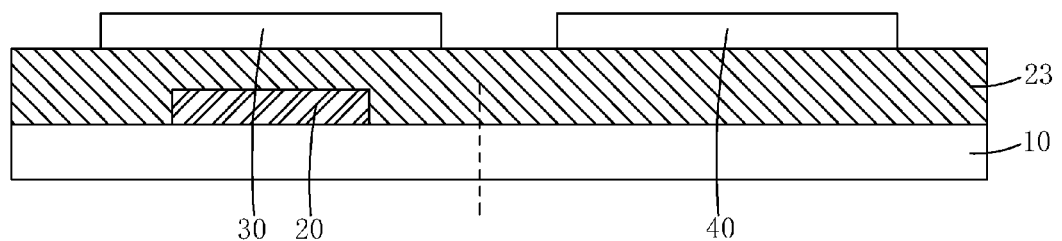
FIG. 4 is a schematic view illustrating step 2 of the array substrate manufacturing method according to the present invention.

Step 2: as shown in FIG. 4, forming a buffer layer 23 on the light shielding layer 20 and the base plate 10, forming an amorphous layer on the buffer layer 23, applying a laser annealing process subject the amorphous layer to crystallization treatment so as to form a poly silicon layer, applying a photolithographic process to subject the poly silicon layer to a patterning operation to obtain a first poly silicon section 30 located above and corresponding to the light shielding layer 20 and a second poly silicon section 40 that is spaced from the first poly silicon section 30.

Arranging the first poly silicon section 30 above the light shielding layer 20 would effectively prevent light from entering a channel zone of the first poly silicon section 30 so as to achieve an effect of reducing leakage current and improving electrical performance of a thin-film transistor (TFT) device. A channel zone of the second poly silicon section 40 can be covered from the outside of the array substrate with other light shielding material.

Figure 5:
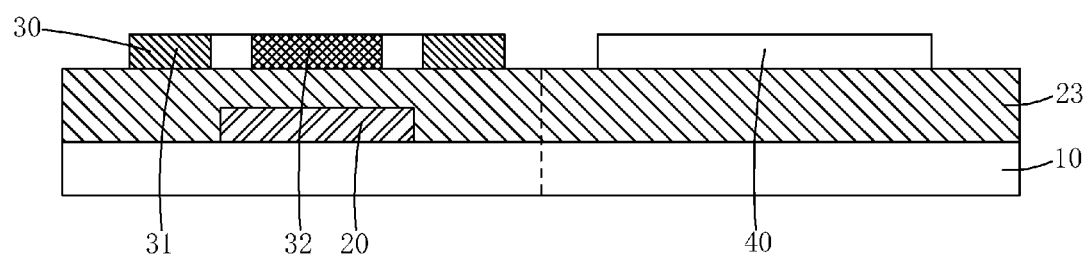
FIG. 5 is a schematic view illustrating step 3 of the array substrate manufacturing method according to the present invention.

Step 3: as shown in FIG. 5, using a mask to subject a middle area of the first poly silicon section 30 to P type light doping to obtain a first channel zone 32, and then using a mask to subject two opposite end portions of the first poly silicon section 30 to N type heavy doping to obtain N type heavy doping zones 31 at the two ends.

Figure 6:
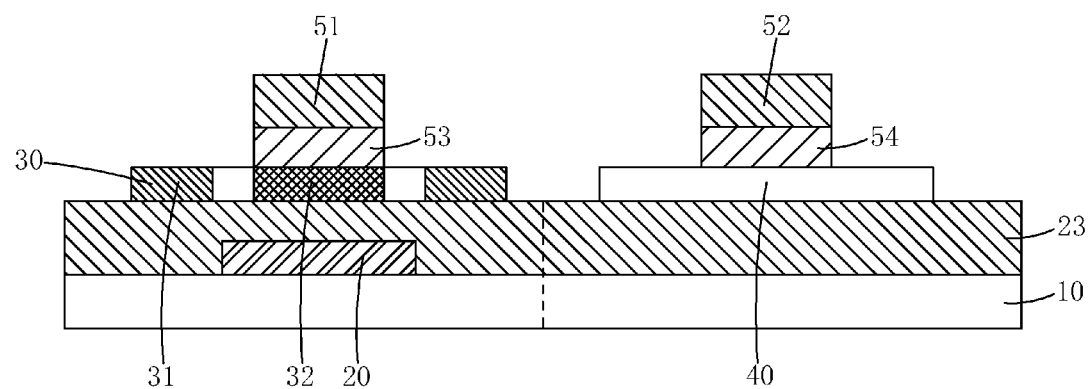
FIG. 6 is a schematic view illustrating step 4 of the array substrate manufacturing method according to the present invention.

Step 4: as shown in FIG. 6, depositing a gate insulation layer on the first poly silicon section 30, the second poly silicon section 40, and the buffer layer 23, depositing a second metal layer on the gate insulation layer, applying a photolithographic process to subject the gate insulation layer and the second metal layer to a patterning operation to obtain a first gate insulation layer 53 and a second gate insulation layer 54 that are in the gate insulation layer and respectively correspond to the middle areas of the first poly silicon section 30 and the second poly silicon section 40 and a first gate electrode 51 and a second gate electrode 52 that are in the second metal layer and respectively located above the first and second gate insulation layers 53, 54 to align with the first and second gate insulation layers 53, 54.

Figure 7:
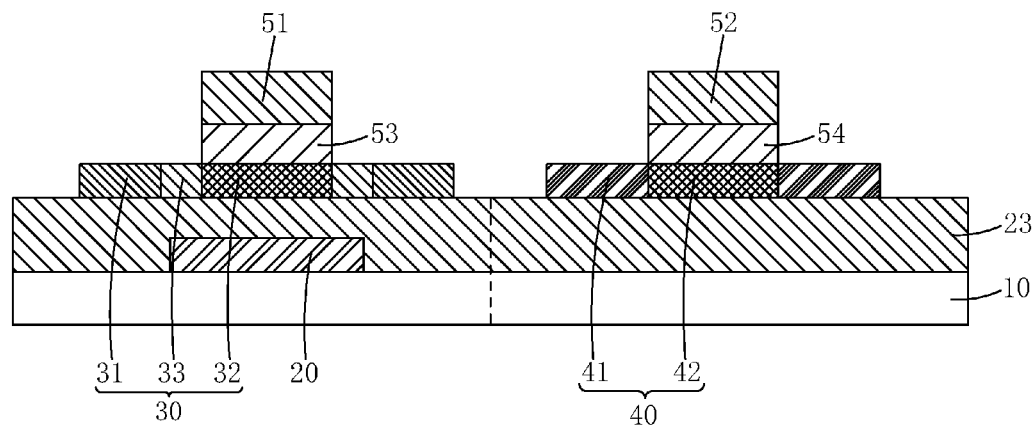
FIG. 7 is a schematic view illustrating step 5 of the array substrate manufacturing method according to the present invention.

Step 5: as shown in FIG. 7, using the first gate electrode 51 as a mask to subject portions of the first poly silicon section 30 that are located between the first channel zone 32 and the N type heavy doping zones 31 to N type light doping, so as to obtain N type light doping zones 33, and using a mask to subject two end portions of the second poly silicon section 40 to P type heavy doping so as to obtain P type heavy doping zones 41 at the two ends and a second channel zone 42 between the two P type heavy doping zones 41.

Figure 8:
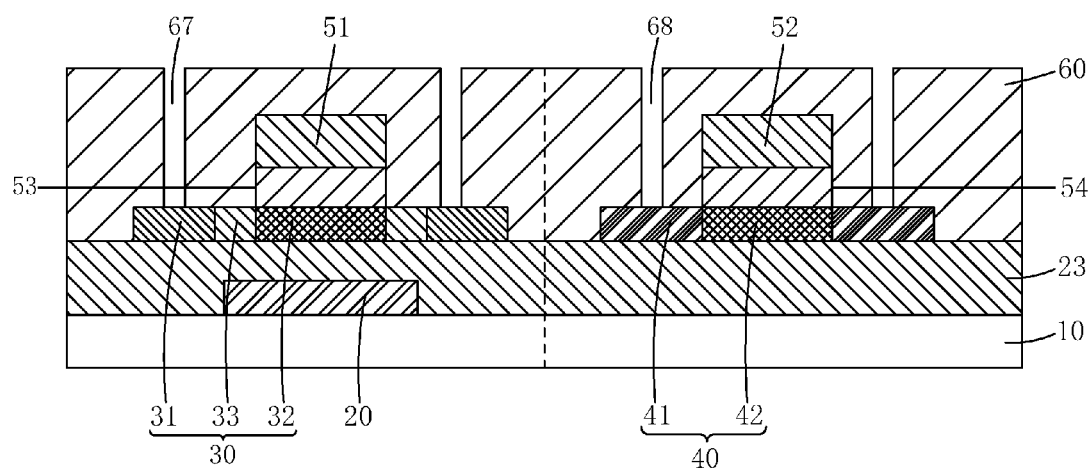
FIG. 8 is a schematic view illustrating step 6 of the array substrate manufacturing method according to the present invention.

Step 6: as shown in FIG. 8, depositing an interlayer insulation layer 60 on the first gate electrode 51, the second gate electrode 52, the first poly silicon section 30, the second poly silicon section 40, and the buffer layer 23, applying a photolithographic process to subject the interlayer insulation layer 60 to a patterning operation so as to form, in the interlayer insulation layer 60, first vias 67 located above and corresponding to the N type heavy doping zones 31 and second vias 68 located above and corresponding to the P type heavy doping zones 41; and then subjecting the interlayer insulation layer 60 to dehydrogenation and activation.

Specifically, rapid thermal annealing (RTA) is applied to carry out dehydrogenation and activation of the interlayer insulation layer 60.

Figure 9:
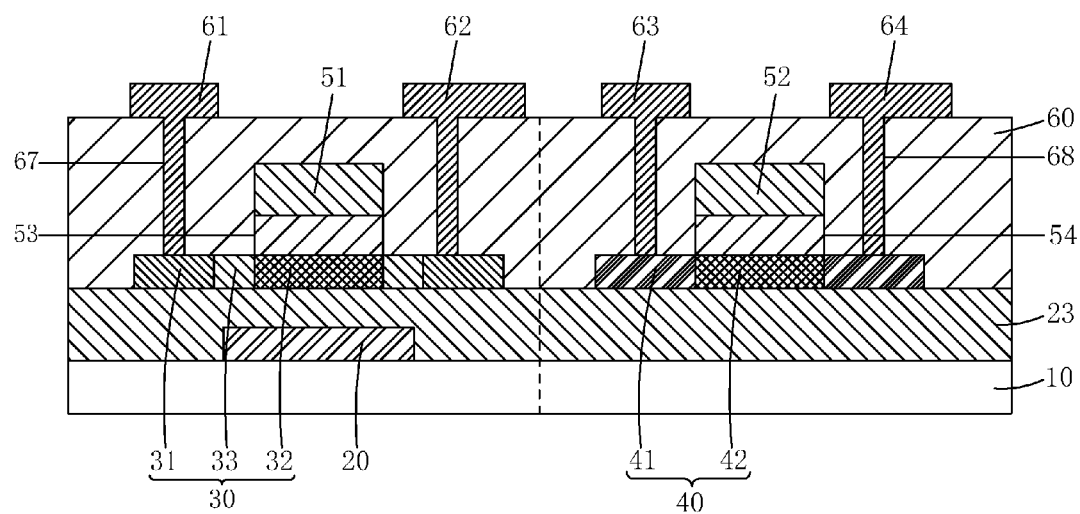
FIG. 9 is a schematic view illustrating step 7 of the array substrate manufacturing method according to the present invention.

Step 7: as shown in FIG. 9, depositing a third metal layer on the interlayer insulation layer 60 and subjecting the third metal layer to a patterning operation to obtain a first source electrode 61, a first drain electrode 62, a second source electrode 63, and a second drain electrode 64 that are spaced from each other such that the first source electrode 61 and the first drain electrode 62 are respectively connected, through the first vias 67, to the N type heavy doping zones 31 and the second source electrode 63 and the second drain electrode 64 are respectively connected, through the second vias 68, to the P type heavy doping zones 41.

Figure 10:
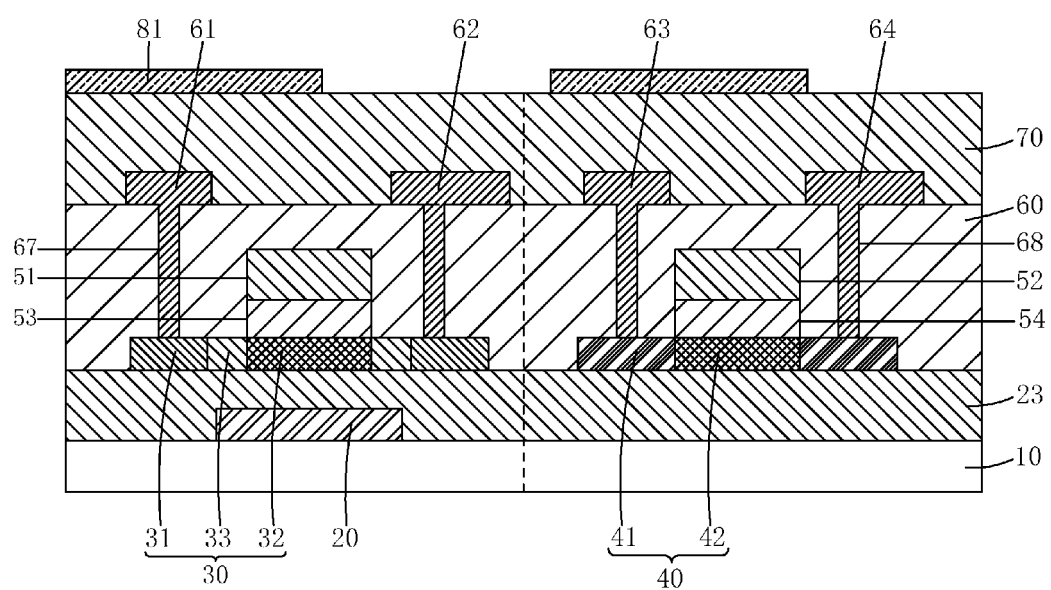
FIG. 10 is a schematic view illustrating step 8 of the array substrate manufacturing method according to the present invention.

Step 8: as shown in FIG. 10, coating an organic photoresist material on the first source electrode 61, the first drain electrode 62, the second source electrode 63, the second drain electrode 64, and the interlayer insulation layer 60 to form a planarization layer 70; and depositing a first transparent conductive layer on the planarization layer 70 and subjecting the first transparent conductive layer to a patterning operation to obtain a common (COM) electrode 81.

Figure 11:
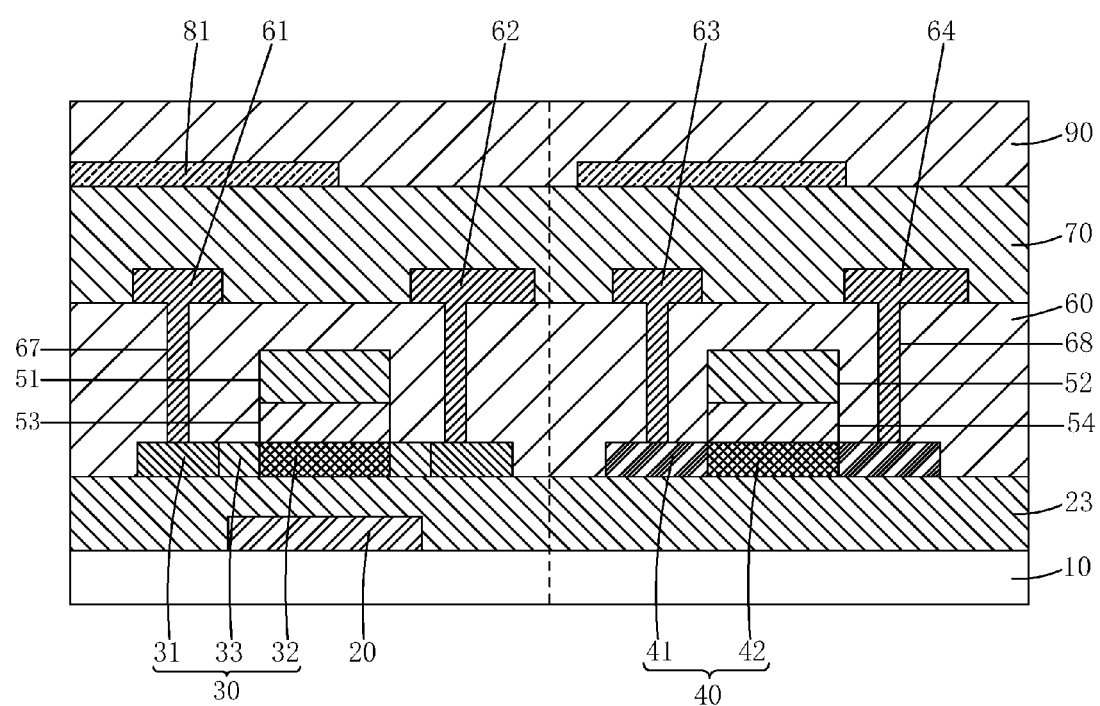
FIG. 11 is a schematic view illustrating step 9 of the array substrate manufacturing method according to the present invention.

Step 9: as shown in FIG. 11, applying an evaporation or jet printing process to the common electrode 81 and the planarization layer 70 to deposit an organic photoresist material to form a passivation protection layer 90.

Further, Step 10 may additionally comprises: subjecting the passivation protection layer 90 to irradiation of ultraviolet light to thin the passivation protection layer 90 so as to increase light transmittability thereof.

Specifically, the passivation protection layer 90 has a dielectric constant that is around 3-4, which compared to the conventionally used passivation protection layer made of a silicon nitride material having a dielectric constant that is around 6-9, allows for reduction of the thickness of the passivation protection layer 90 to suit the need for capacitance of the array substrate.

Figure 12:
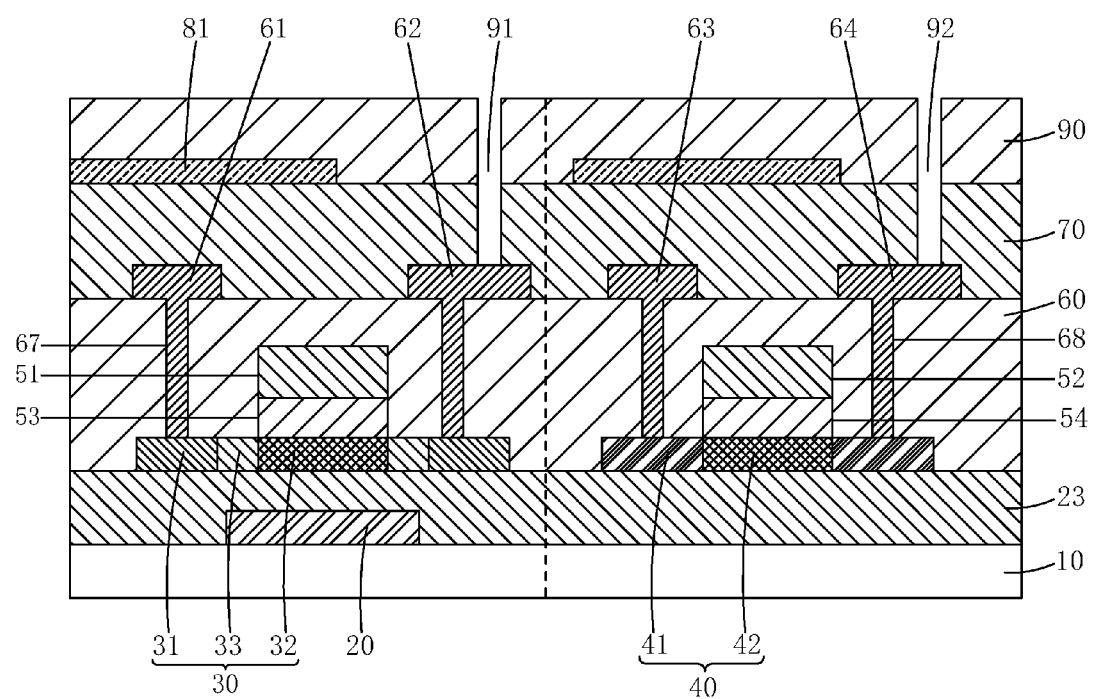
FIG. 12 is a schematic view illustrating step 10 of the array substrate manufacturing method according to the present invention.

Step 10: as shown in FIG. 12, using a mask to subject the passivation protection layer 90 and the planarization layer 70 to exposure and development so as to obtain a third via 91 located above and corresponding to the first drain electrode 62 and a fourth via 92 located above and corresponding to the second drain electrode 64.

Figure 13:
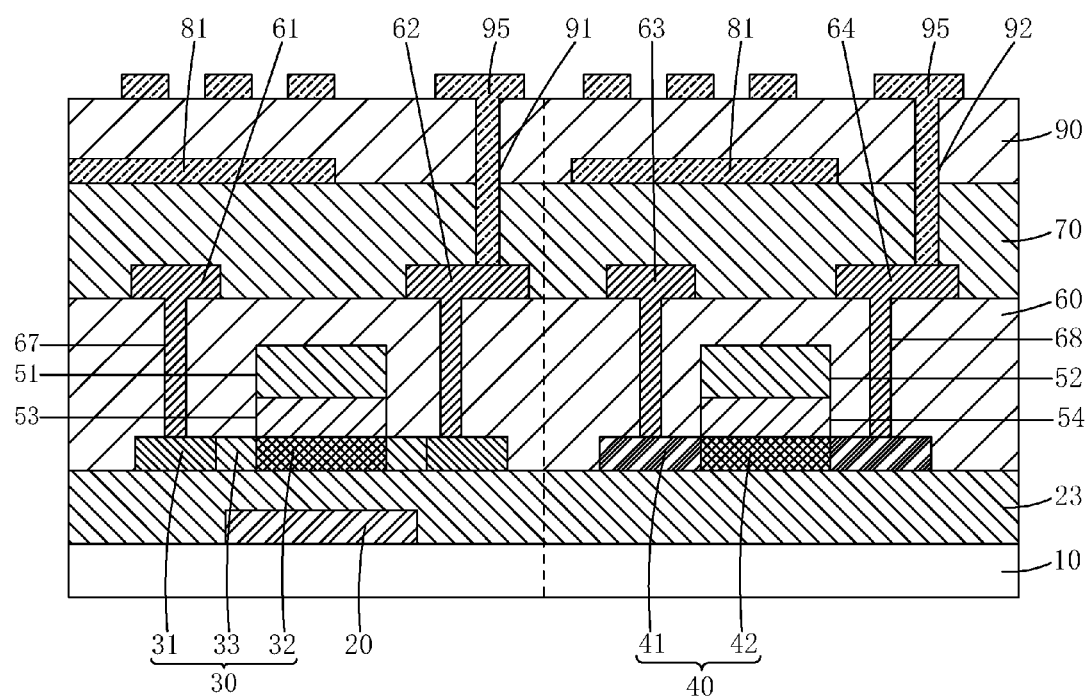
FIG. 13 is a schematic view illustrating step 11 of the array substrate manufacturing method according to the present invention and is also a schematic view illustrating an array substrate according to the present invention.

Step 11: as shown in FIG. 13, depositing a second transparent conductive layer on the passivation protection layer 90 and subjecting the second transparent conductive layer to a patterning operation so as to obtain a pixel electrode 95, wherein the pixel electrode 95 is connected, through the third via 91 and the fourth via 92, to the first drain electrode 62 and the second drain electrode 64, respectively.

Specifically, the first metal layer, the second metal layer, the third metal layer are each formed of a material comprising one of molybdenum, titanium, aluminum, and copper or a stacked combination of multiple ones thereof.

Specifically, the buffer layer 23, the first and second gate insulation layers 53, 54, and the interlayer insulation layer 60 are each a silicon oxide layer, a silicon nitride layer, or a composite layer of stacked silicon oxide layer and silicon nitride layer.

Specifically, the first transparent conductive layer and the second transparent conductive layer are made of a material comprising a metal oxide and the metal oxide can be one or more of indium tin oxide, indium zinc oxide, aluminum tin oxide, aluminum zinc oxide, and indium germanium zinc oxide.

The ions used in P type light doping and P type heavy doping can be boron (B) ions or gallium (Ga) ions and the ions used in N type light doping and N type heavy doping can be phosphorous (P) ions or arsenic (As) ions.

The first source electrode 61, the first drain electrode 62, the first gate electrode 51, and the first poly silicon section 30 constitute an NMOS (Negative-Channel Metal-Oxide-Semiconductor) transistor; and the second source electrode 63, the second drain electrode 64, the second gate electrode 52, and the second poly silicon section 40 constitute a PMOS (Positive-Channel Metal-Oxide-Semiconductor) transistor.

The above-described array substrate manufacturing method uses an organic photoresist material to form a passivation protection layer 90 for substituting the conventional passivation protection layer that is made of a silicon nitride material and then applies one mask to subject the passivation protection layer 90 and a planarization layer 70 to exposure and development so as to obtain a third via 91 that is located above the first drain electrode 62 and a fourth via 92 that is located above the second drain electrode 64 and, thus, compared the prior art techniques, saves one mask and reduces one etching process so as to achieve the purposes of simplifying the manufacturing process and saving manufacturing cost.

Referring to FIG. 13, in combination with FIGS. 3-12, the present invention also provides an array substrate, which comprises a base plate 10, a light shielding layer 20 located on the base plate 10, a buffer layer 23 located on the light shielding layer 20 and the base plate 10, a first poly silicon section 30 and a second poly silicon section 40 located on the buffer layer 23, a first gate insulation layer 53 and a second gate insulation layer 54 respectively located on middle areas of the first poly silicon section 30 and the second poly silicon section 40, a first gate electrode 51 and a second gate electrode 52 respectively located on the first gate insulation layer 53 and the second gate insulation layer 54 and in alignment with the first and second gate insulation layers 53, 54, an interlayer insulation layer 60 located on the first gate electrode 51, the second gate electrode 52, the first poly silicon section 30, the second poly silicon section 40, and the buffer layer 23, a first source electrode 61, a first drain electrode 62, a second source electrode 63, and a second drain electrode 64 located on the interlayer insulation layer 60, a planarization layer 70 located on the first source electrode 61, the first drain electrode 62, the second source electrode 63, the second drain electrode 64, and the interlayer insulation layer 60, a common electrode 81 located on the planarization layer 70, a passivation protection layer 90 located on the common electrode 81 and the planarization layer 70, and a pixel electrode 95 located on the passivation protection layer 90.

Specifically, the first poly silicon section 30 comprises a first channel zone 32 corresponding to and located under the first gate insulation layer 53, N type heavy doping zones 31 respectively located at two ends, and N type light doping zones 33 respectively located between the N type heavy doping zones 31 and the first channel zone 32. The second poly silicon section 40 comprises a first channel zone 41 corresponding to and located under the second gate insulation layer 54 and P type heavy doping zones 42 respectively located at two ends. The N type heavy doping zones 31 and the N type light doping zone 33 are doped with ions that can be phosphorous (P) ions or arsenic (As) ions and the P type heavy doping zones 41 and the first channel zone 32 are doped with ions that can be boron (B) ions or gallium (Ga) ions.

Specifically, the interlayer insulation layer 60 comprises first vias 67 corresponding to and located above the N type heavy doping zones 31 and second vias 68 corresponding to and located above the P type heavy doping zones 41. The first source electrode 61 and the first drain electrode 62 are respectively connected, through the first vias 67, to the N type heavy doping zones 31 and the second source electrode 63 and the second drain electrode 64 are respectively connected, through the second vias 68, to the P type heavy doping zones 41.

The planarization layer 70 and the passivation protection layer 90 are both made of a material comprises an organic photoresist. The passivation protection layer 90 and the planarization layer 70 comprise, formed therein, a third via 91 corresponding to and located above the first drain electrode 62 and a fourth via 92 corresponding to and located above the second drain electrode 64. The pixel electrode 95 is electrically connected, through the third via 91 and the fourth via 92, to the first drain electrode 62 and the second drain electrode 64 respectively.

Specifically, the first source electrode 61, the first drain electrode 62, the first gate electrode 51, and the first poly silicon section 30 constitute an NMOS transistor and the second source electrode 63, the second drain electrode 64, the second gate electrode 52, and the second poly silicon section 40 constitute a PMOS transistor.

Specifically, the first poly silicon section 30 is arranged to correspond to and be located above the light shielding layer 20. Due to shielding by the light shielding layer 20, light is effectively prevented from entering the first channel zone 32 of the first poly silicon section 30 so as to achieve an effect of reducing leakage current and improving electrical performance of a TFT device. The second channel zone 42 of the second poly silicon section 40 can be covered from the outside of the array substrate with other light shielding material.

Specifically, the base plate 10 is a transparent plate, and preferably a glass plate.

The light shielding layer 20, the first gate electrode 51, the second gate electrode 52, the first source electrode 61, the first drain electrode 62, the second source electrode 63, and the second drain electrode 64 are made of a material comprising one of molybdenum (Mo), titanium (Ti), aluminum (Al), and copper (Cu), or a stacked combination of multiple ones thereof.

The buffer layer 23, the first and second gate insulation layers 53, 54, the interlayer insulation layer 60 are each a silicon oxide ($SiO_x$) layer, a silicon nitride ($SiN_x$) layer, or a composite layer of stacked silicon oxide layer and silicon nitride layer.

The common electrode 81 and the pixel electrode 95 are made of a material comprising metal oxide and the metal oxide can be one or more of indium tin oxide, indium zinc oxide, aluminum tin oxide, aluminum zinc oxide, and indium germanium zinc oxide.

Specifically, the passivation protection layer 90 has a dielectric constant that is around 3-4, and the thickness of the passivation protection layer 90 can be adjusted to suit the need of capacitance for the array substrate.

The above-described array substrate uses an organic photoresist material to make a passivation protection layer 90 for substituting a conventional passivation protection layer that is made of a silicon nitride material such that a third via 91 that corresponds to and is located above a first drain electrode 92 and a fourth via 91 that corresponds to and is located above a second drain electrode 64, both formed in the passivation protection layer 90 and a planarization layer 70, can be formed through exposure with one mask, whereby compared to a prior art manufacturing process of an array substrate, one mask is save and one etching process is reduced so as to achieve the purposes of simplifying the manufacturing process and saving manufacturing cost.

In summary, the present invention provides an array substrate manufacturing method and an array substrate. The array substrate manufacturing method of the present invention uses an organic photoresist material to form a passivation protection layer 90 for substituting the conventional passivation protection layer that is made of a silicon nitride material and applies one mask to subject the passivation protection layer 90 and a planarization layer 70 to exposure and development so as to obtain a third via 91 that is located above the first drain electrode 62 and a fourth via 92 that is located above the second drain electrode 64 and, thus, compared the prior art techniques, saves one mask and reduces one etching process so as to achieve the purposes of simplifying the manufacturing process and saving manufacturing cost. The array substrate of the present invention has a simple structure and low manufacturing cost and possesses excellent electrical performance.

Based on the description given above, those having ordinary skills of the art may easily contemplate various changes and modifications of the technical solution and technical ideas of the present invention and all these changes and modifications are considered within the protection scope of right for the present invention.

What is claimed is:

1. An array substrate manufacturing method, comprising the following steps:

(1) providing a base plate, depositing a first metal layer on the base plate, and subjecting the first metal layer to a patterning operation to obtain a light shielding layer;

(2) forming a buffer layer on the light shielding layer and the base plate, forming an amorphous layer on the buffer layer, subjecting the amorphous layer to crystallization treatment so as to form a poly silicon layer, applying a photolithographic process to subject the poly silicon layer to a patterning operation to obtain a first poly silicon section located above and corresponding to the light shielding layer and a second poly silicon section that is spaced from the first poly silicon section;

(3) using a mask to subject a middle area of the first poly silicon section to P type light doping to obtain a first channel zone, and then using a mask to subject two opposite end portions of the first poly silicon section to N type heavy doping to obtain N type heavy doping zones at the two ends;

(4) depositing a gate insulation layer on the first poly silicon section, the second poly silicon section, and the buffer layer, depositing a second metal layer on the gate insulation layer, applying a photolithographic process to subject the gate insulation layer and the second metal layer to a patterning operation to obtain a first gate insulation layer and a second gate insulation layer that are in the gate insulation layer and respectively correspond to the middle areas of the first poly silicon section and the second poly silicon section and a first gate electrode and a second gate electrode that are in the second metal layer and respectively located above the first and second gate insulation layers to align with the first and second gate insulation layers;

(5) using the first gate electrode as a mask to subject portions of the first poly silicon section that are located between the first channel zone and the N type heavy doping zones to N type light doping, so as to obtain N type light doping zones, and using a mask to subject two end portions of the second poly silicon section to P type heavy doping so as to obtain P type heavy doping zones at the two ends and a second channel zone between the two P type heavy doping zones;

(6) depositing an interlayer insulation layer on the first gate electrode, the second gate electrode, the first poly silicon section, the second poly silicon section, and the buffer layer, applying a photolithographic process to subject the interlayer insulation layer to a patterning operation so as to form, in the interlayer insulation layer, first vias located above and corresponding to the N type heavy doping zones and second vias located above and corresponding to the P type heavy doping zones;

(7) depositing a third metal layer on the interlayer insulation layer and subjecting the third metal layer to a patterning operation to obtain a first source electrode, a first drain electrode, a second source electrode, and a second drain electrode that are spaced from each other such that the first source electrode and the first drain electrode are respectively connected, through the first vias, to the N type heavy doping zones and the second source electrode and the second drain electrode are respectively connected, through the second vias, to the P type heavy doping zones;

(8) forming a planarization layer on the first source electrode, the first drain electrode, the second source electrode, the second drain electrode, and the interlayer insulation layer; and depositing a first transparent conductive layer on the planarization layer and subjecting the first transparent conductive layer to a patterning operation to obtain a common electrode;

(9) depositing an organic photoresist material on the common electrode and the planarization layer to form a passivation protection layer;

(10) using a mask to subject the passivation protection layer and the planarization layer to exposure and development so as to obtain a third via located above and corresponding to the first drain electrode and a fourth via located above and corresponding to the second drain electrode; and

(11) depositing a second transparent conductive layer on the passivation protection layer and subjecting the second transparent conductive layer to a patterning operation so as to obtain a pixel electrode, wherein the pixel electrode is connected, through the third via and the fourth via, to the first drain electrode and the second drain electrode, respectively.

2. The array substrate manufacturing method as claimed in claim 1, wherein in step (2), laser annealing is used for the crystallization treatment of the amorphous layer.

3. The array substrate manufacturing method as claimed in claim 1, wherein step (6) further comprises: subjecting the interlayer insulation layer to dehydrogenation and activation.

4. The array substrate manufacturing method as claimed in claim 3, wherein rapid thermal annealing is applied for dehydrogenation and activation of the interlayer insulation layer.

5. The array substrate manufacturing method as claimed in claim 1, wherein in step (9), an evaporation or jet printing process is applied to deposit the organic photoresist material.

6. The array substrate manufacturing method as claimed in claim 1, wherein step 9 further comprises: subjecting the passivation protection layer to irradiation of ultraviolet light to thin the passivation protection layer 90 so as to increase light transmittability thereof.

7. The array substrate manufacturing method as claimed in claim 1, wherein the planarization layer is made of a material comprising organic photoresist and the passivation protection layer has a dielectric constant that is around 3-4.

8. The array substrate manufacturing method as claimed in claim 1, wherein the base plate is a transparent plate; the first metal layer, the second metal layer, the third metal layer are formed of a material comprising one of molybdenum, titanium, aluminum, and copper or a stacked combination of multiple ones thereof; the buffer layer, the first and second gate insulation layers, and the interlayer insulation layer are each a silicon oxide layer, a silicon nitride layer, or a composite layer of stacked silicon oxide layer and silicon nitride layer; and the first transparent conductive layer and the second transparent conductive layer are made of a material comprising a metal oxide.

9. An array substrate manufacturing method, comprising the following steps:

(1) providing a base plate, depositing a first metal layer on the base plate, and subjecting the first metal layer to a patterning operation to obtain a light shielding layer;

(2) forming a buffer layer on the light shielding layer and the base plate, forming an amorphous layer on the buffer layer, subjecting the amorphous layer to crystallization treatment so as to form a poly silicon layer, applying a photolithographic process to subject the poly silicon layer to a patterning operation to obtain a first poly silicon section located above and corresponding to the light shielding layer and a second poly silicon section that is spaced from the first poly silicon section;

(3) using a mask to subject a middle area of the first poly silicon section to P type light doping to obtain a first channel zone, and then using a mask to subject two opposite end portions of the first poly silicon section to N type heavy doping to obtain N type heavy doping zones at the two ends;

(4) depositing a gate insulation layer on the first poly silicon section, the second poly silicon section, and the buffer layer, depositing a second metal layer on the gate insulation layer, applying a photolithographic process to subject the gate insulation layer and the second metal layer to a patterning operation to obtain a first gate insulation layer and a second gate insulation layer that are in the gate insulation layer and respectively correspond to the middle areas of the first poly silicon section and the second poly silicon section and a first gate electrode and a second gate electrode that are in the second metal layer and respectively located above the first and second gate insulation layers to align with the first and second gate insulation layers;

(5) using the first gate electrode as a mask to subject portions of the first poly silicon section that are located between the first channel zone and the N type heavy doping zones to N type light doping, so as to obtain N type light doping zones, and using a mask to subject two end portions of the second poly silicon section to P type heavy doping so as to obtain P type heavy doping zones at the two ends and a second channel zone between the two P type heavy doping zones;

(6) depositing an interlayer insulation layer on the first gate electrode, the second gate electrode, the first poly silicon section, the second poly silicon section, and the buffer layer, applying a photolithographic process to subject the interlayer insulation layer to a patterning operation so as to form, in the interlayer insulation layer, first vias located above and corresponding to the N type heavy doping zones and second vias located above and corresponding to the P type heavy doping zones;

(7) depositing a third metal layer on the interlayer insulation layer and subjecting the third metal layer to a patterning operation to obtain a first source electrode, a first drain electrode, a second source electrode, and a second drain electrode that are spaced from each other such that the first source electrode and the first drain electrode are respectively connected, through the first vias, to the N type heavy doping zones and the second source electrode and the second drain electrode are respectively connected, through the second vias, to the P type heavy doping zones;

(8) forming a planarization layer on the first source electrode, the first drain electrode, the second source electrode, the second drain electrode, and the interlayer insulation layer; and depositing a first transparent conductive layer on the planarization layer and subjecting the first transparent conductive layer to a patterning operation to obtain a common electrode;

(9) depositing an organic photoresist material on the common electrode and the planarization layer to form a passivation protection layer;

(10) using a mask to subject the passivation protection layer and the planarization layer to exposure and development so as to obtain a third via located above and corresponding to the first drain electrode and a fourth via located above and corresponding to the second drain electrode; and

(11) depositing a second transparent conductive layer on the passivation protection layer and subjecting the second transparent conductive layer to a patterning operation so as to obtain a pixel electrode, wherein the pixel electrode is connected, through the third via and the fourth via, to the first drain electrode and the second drain electrode, respectively;

wherein in step (2), laser annealing is used for the crystallization treatment of the amorphous layer; and wherein step (6) further comprises: subjecting the interlayer insulation layer to dehydrogenation and activation.

10. The array substrate manufacturing method as claimed in claim 9, wherein rapid thermal annealing is applied for dehydrogenation and activation of the interlayer insulation layer.

11. The array substrate manufacturing method as claimed in claim 9, wherein in step (9), an evaporation or jet printing process is applied to deposit the organic photoresist material.

12. The array substrate manufacturing method as claimed in claim 9, wherein step 9 further comprises: subjecting the passivation protection layer to irradiation of ultraviolet light to thin the passivation protection layer 90 so as to increase light transmittability thereof.

13. The array substrate manufacturing method as claimed in claim 9, wherein the planarization layer is made of a material comprising organic photoresist and the passivation protection layer has a dielectric constant that is around 3-4.

14. The array substrate manufacturing method as claimed in claim 9, wherein the base plate is a transparent plate; the first metal layer, the second metal layer, the third metal layer are formed of a material comprising one of molybdenum, titanium, aluminum, and copper or a stacked combination of multiple ones thereof; the buffer layer, the first and second gate insulation layers, and the interlayer insulation layer are each a silicon oxide layer, a silicon nitride layer, or a composite layer of stacked silicon oxide layer and silicon nitride layer; and the first transparent conductive layer and the second transparent conductive layer are made of a material comprising a metal oxidel.

* * * * *